(12) United States Patent
O'Meara et al.

(10) Patent No.: US 9,831,099 B2
(45) Date of Patent: Nov. 28, 2017

(54) METHOD AND APPARATUS FOR MULTI-FILM DEPOSITION AND ETCHING IN A BATCH PROCESSING SYSTEM

(71) Applicant: Tokyo Electron Limited, Minato-ku, Tokyo (JP)

(72) Inventors: David L. O'Meara, Albany, NY (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/428,905

(22) Filed: Feb. 9, 2017

(65) Prior Publication Data
US 2017/0236719 A1    Aug. 17, 2017

Related U.S. Application Data

(60) Provisional application No. 62/294,977, filed on Feb. 12, 2016.

(51) Int. Cl.
*H01L 21/20* (2006.01)
*H01L 21/302* (2006.01)
*H01L 21/311* (2006.01)
*H01L 21/02* (2006.01)
(Continued)

(52) U.S. Cl.
CPC .... *H01L 21/31116* (2013.01); *H01L 21/0228* (2013.01); *H01L 21/02123* (2013.01); *H01L 21/0337* (2013.01); *H01L 21/0338* (2013.01); *H01L 21/6719* (2013.01)

(58) Field of Classification Search
CPC ............. H01L 21/0337; H01L 21/0338; H01L 21/31116; H01L 21/02123; H01L 21/6719
See application file for complete search history.

(56) References Cited

U.S. PATENT DOCUMENTS

| 6,972,055 B2 | 12/2005 | Sferlazzo |
| 8,043,432 B2 | 10/2011 | Dip |
| 8,465,591 B2 | 6/2013 | Kato et al. |

(Continued)

FOREIGN PATENT DOCUMENTS

KR    1020140140462 A    12/2014

OTHER PUBLICATIONS

Korean Intellectual Property Office (KIPO), The International Search Report and the Written Opinion for related International application No. PCT/US2017/017216, dated Apr. 28, 2017, 12 pages.

*Primary Examiner* — Savitr Mulpuri

(57) ABSTRACT

Embodiments of the invention describe a method and apparatus for multi-film deposition and etching in a batch processing system. According to one embodiment, the method includes arranging the substrates on a plurality of substrate supports in a process chamber, where the process chamber contains processing spaces defined around an axis of rotation in the process chamber, rotating the plurality of substrate supports about the axis of rotation, depositing a first film on a patterned film on each of the substrates by atomic layer deposition, and etching a portion of the first film on each of the substrates, where etching a portion of the first film includes removing at least one horizontal portion of the first film while substantially leaving vertical portions of the first film. The method further includes repeating the depositing and etching steps for a second film that contains a different material than the first film.

19 Claims, 6 Drawing Sheets

(51) Int. Cl.
*H01L 21/67* (2006.01)
*H01L 21/033* (2006.01)

(56) References Cited

U.S. PATENT DOCUMENTS

| | | | |
|---|---|---|---|
| 8,809,169 | B2 | 8/2014 | O'Meara et al. |
| 9,443,731 | B1 * | 9/2016 | O'Meara ........... H01L 21/31144 |
| 2009/0186485 | A1 | 7/2009 | Lam et al. |
| 2012/0210937 | A1 | 8/2012 | Thakur et al. |
| 2013/0084688 | A1 | 4/2013 | O'Meara et al. |
| 2015/0194298 | A1 | 7/2015 | Lei et al. |
| 2015/0206774 | A1 | 7/2015 | Singh |

\* cited by examiner

METHOD AND APPARATUS FOR MULTI-FILM DEPOSITION AND ETCHING IN A BATCH PROCESSING SYSTEM

CROSS-REFERENCE TO RELATED APPLICATIONS

This application is related to and claims priority to U.S. provisional application Ser. No. 62/294,977 filed on Feb. 12, 2016, the entire contents of which are herein incorporated by reference.

FIELD OF THE INVENTION

The present invention generally relates to a semiconductor manufacturing, and more particularly to a method and apparatus for multi-film deposition and etching in a batch processing system.

BACKGROUND OF THE INVENTION

As dimensions for microelectronics are reduced and the demand for such materials increase, thin semiconductor films having uniform composition and uniform thickness over a larger substrate area are increasingly desirable. A common process used for depositing thin films on a substrate is Chemical Vapor Deposition (CVD), which provides for deposition of relatively uniform films over complex device topography. In a typical CVD process, the substrate is exposed to two or more volatile precursors, which react and/or decompose on the substrate surface to produce the desired thin film.

Despite improvements of CVD over previous deposition techniques, CVD has several disadvantages. For example, because CVD is flux-dependent, deposition conditions such as substrate temperature, pressure, and gas flow rate must be accurately and consistently maintained to produce a desired thin film of uniform thickness. Additionally, CVD tends to incorporate undesired reaction products into the deposited thin film, thereby diminishing the purity of the thin film.

Atomic Layer Deposition (ALD), which represents a variant of CVD, is a contemporary technology for depositing thin films now emerging as a potentially superior method of achieving highly uniform, conformal film deposition. ALD is a process wherein conventional CVD processes are divided into separate deposition steps to construct the thin film by sequentially depositing single atomic monolayers in each deposition step. The technique of ALD is based on the principle of the formation of a saturated monolayer of reactive precursor molecules by chemisorption. A typical ALD process consists of injecting a first precursor for a period of time until a saturated monolayer is formed on the substrate. Then, the first precursor is purged from the chamber using an inert gas. This is followed by injecting a second precursor into the chamber, also for a period of time, thus forming a layer on the wafer from the reaction of the second precursor with the first precursor. Then, the second precursor is purged from the chamber. This process of introducing the first precursor, purging the process chamber, introducing the second precursor, and purging the process chamber is repeated a number of times to achieve a film of a desired thickness.

ALD thin films may be deposited using single-wafer reactors with the reactive gas precursors injected into the process chamber. However, a major disadvantage of a single-wafer reactor is that it has a significantly diminished commercial value because of its relatively low throughput. Another disadvantage is that the process chamber must be purged before each individual gas precursor is introduced.

SUMMARY OF THE INVENTION

Embodiments of the invention describe a method and apparatus for multi-film deposition and etching in a batch processing system. According to one embodiment, the method includes a) arranging the substrates on a plurality of substrate supports in a process chamber, where the process chamber contains processing spaces defined around an axis of rotation in the process chamber, b) rotating the plurality of substrate supports about the axis of rotation, c) depositing a first film on a patterned film on each of the substrates by atomic layer deposition, d) etching a portion of the first film on each of the substrates, where etching a portion of the first film includes removing at least one horizontal portion of the first film while substantially leaving vertical portions of the first film, e) depositing a second film on the first film on each of the substrates by atomic layer deposition, where the second film contains a different material than the first film, and f) etching a portion of the second film on each of the substrates, where etching a portion of the second film includes removing at least one horizontal portion of the second film while substantially leaving vertical portions of the second film.

DETAILED DESCRIPTION OF SEVERAL EMBODIMENTS

Figure 1:
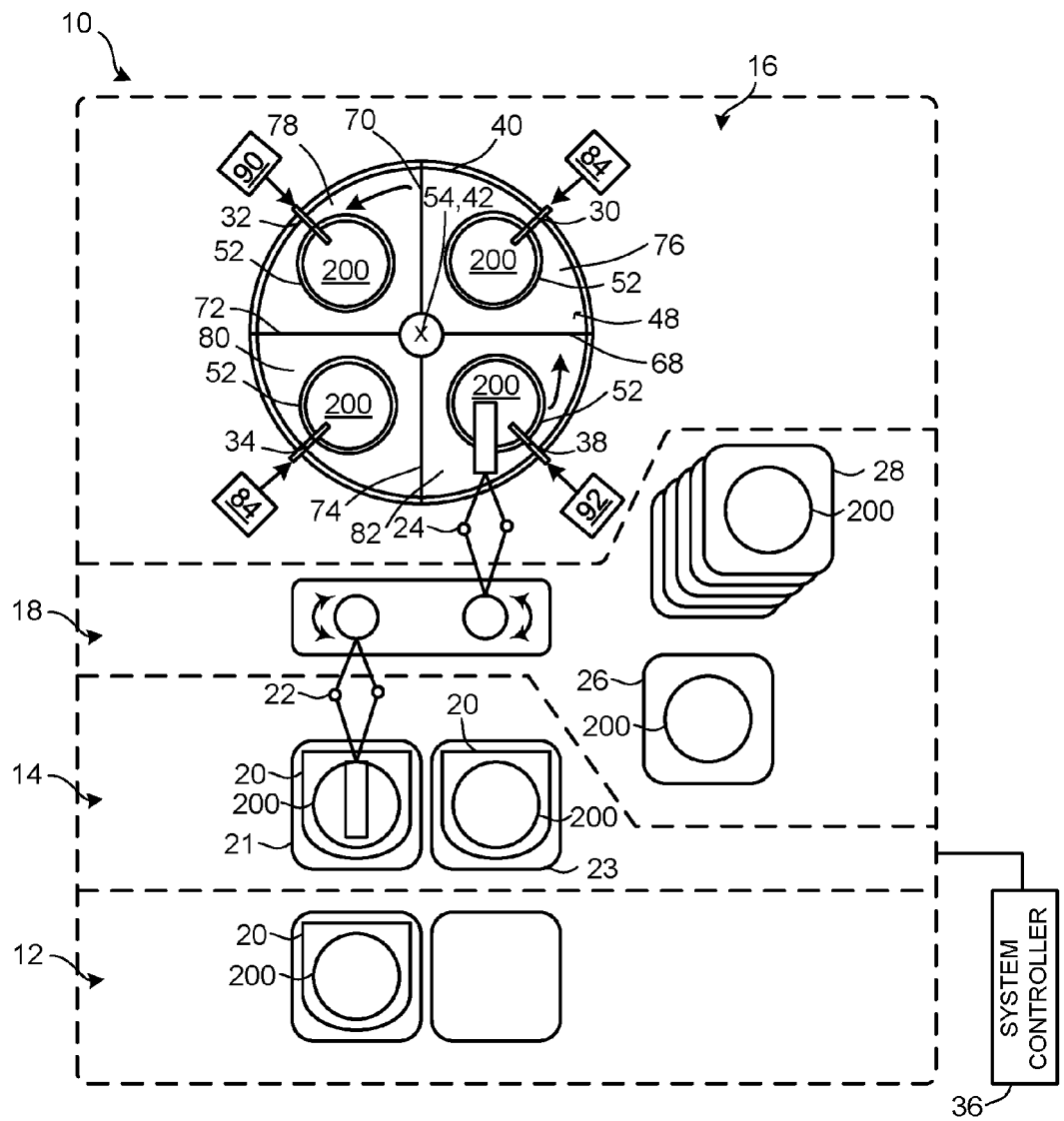
FIG. 1 is a diagrammatic top plan view of a deposition system including a process chamber according to an embodiment of the invention.

Embodiments of the invention address many disadvantages associated with single-wafer and multi-wafer reactors. Some of these disadvantages include relatively low throughput of single-wafer reactors, and multi-wafer reactors have a characteristic disadvantage of employing showerhead injectors that inject the precursor gases in an axially symmetric direction generally perpendicular to the wafer surface. As a result, although faster process times are achieved, multi-wafer ALD process chambers may produce thin films with reduced thickness uniformity.

Some embodiments of the invention combine deposition and etch processing to form thin patterning hard masks, with critical dimensions controlled by ALD film thickness. In typical semiconductor double and quad patterning methodology, an ALD film is deposited on a mandrel (patterned film), followed by a spacer etch and mandrel removal, conventionally etched in a separate type of equipment, to isolate the spacers to be used as a hardmask for subsequent patterning etch.

A method for processing substrates in a batch processing system is provided. The method includes a) arranging the substrates on a plurality of substrate supports in a process chamber, where the process chamber contains processing spaces defined around an axis of rotation in the process chamber, b) rotating the plurality of substrate supports about the axis of rotation, c) depositing a first film on a patterned film on each of the substrates by ALD, and d) etching a portion of the first film on each of the substrates, where etching a portion of the first film includes removing at least one horizontal portion of the first film while substantially leaving vertical portions of the first film. The method further includes e) depositing a second film on the first film on each of the substrates by ALD, where the second film contains a different material than the first film, and f) etching a portion of the second film on each of the substrates, where etching a portion of the second film includes removing at least one horizontal portion of the second film while substantially leaving vertical portions of the second film. According to another embodiment, the method further includes repeating c) and d), e) and f), or c), d), e) and f), at least once.

The first film may be selected from the group consisting of silicon dioxide, silicon nitride, silicon oxynitride, other metal or non-metal oxides, nitrides, or silicides, and a high-k material. The high-k material may be selected from the group consisting of titanium oxide, titanium nitride, aluminum oxide, aluminum nitride, hafnium oxide, zirconium oxide, and combinations thereof. According to one embodiment, depositing the first film can include injecting a first deposition precursor into a first processing space defined by a first included angle about the axis of rotation, exposing a top surface of each of the substrates to the first deposition precursor in the first processing space during each full rotation to bond molecules of the first deposition precursor, and exposing each of the substrates to an inert atmosphere within a second processing space defined by a second included angle about the axis of rotation during each full rotation. The method further includes injecting a second deposition precursor into a third processing space defined by a third included angle about the axis of rotation and separated from the first processing space by the second processing space, exposing the top surface of each of the substrates to the second deposition precursor during each full rotation, and exposing each of the substrates to an inert atmosphere within a fourth processing space defined by a fourth included angle about the axis of rotation and separated from the second processing space by the third processing space. The method further includes re-exposing the top surface of each of the substrates to the first and second deposition precursors by repeatedly rotating the substrates through the first, second, third, and fourth processing spaces for incrementally depositing the first film on each of the substrates.

According to one embodiment, the first deposition precursor may be selected from the group consisting of a silicon precursor, a germanium precursor, and a metal-containing precursor. The metal-containing precursor may be selected from the group consisting of a titanium precursor, an aluminum precursor, a hafnium precursor, a zirconium precursor, and combinations thereof. The second deposition precursor can include an oxidation source, a nitridation source, or both an oxidation source and a nitridation source. Additionally, a silicide source or other reactant agent can be used to remove or replace surface ligands of the first deposition precursor molecule to continue the ALD cycle. In one example, the oxidation source can include a plasma-excited oxidation gas. In another example, the nitridation source can include a plasma-excited nitridation gas.

According to one embodiment, etching the portion of the first film can include injecting a first etching gas into one or more of the processing spaces, and exposing the first film to the first etching gas to remove the portion of the first film. In another case, a material or first etching gas can be chosen to absorb within a certain depth of the original material (first film) to be removed, and a second chemical used to remove or etch the modified surface layer of the original material, providing a layer-by-layer etch removal of the original material, similar to an Atomic Layer Etching mechanism (ALE). In one example, the first etching gas can include a plasma-excited etching gas.

The second film may be selected from the group consisting of silicon dioxide, silicon nitride, silicon oxynitride, other metal or non-metal oxides, nitrides, or silicides, and a high-k material. The high-k material may be selected from the group consisting of titanium oxide, titanium nitride, aluminum oxide, aluminum nitride, hafnium oxide, zirconium oxide, and combinations thereof. According to one embodiment, depositing the second film can include injecting a third deposition precursor into a first processing space defined by a first included angle about the axis of rotation, exposing a top surface of each of the substrates to a third deposition precursor in the first processing space during each full rotation to bond molecules of the third deposition precursor, and exposing each of the substrates to an inert atmosphere within a second processing space defined by a second included angle about the axis of rotation during each full rotation. The method further includes injecting a fourth deposition precursor into a third processing space defined by a third included angle about the axis of rotation and separated from the first processing space by the second processing space, exposing the top surface of each of the substrates to the fourth deposition precursor during each full rotation, and exposing each of the substrates to an inert atmosphere within a fourth processing space defined by a fourth included angle about the axis of rotation and separated from the second processing space by the third processing space. The method further includes re-exposing the top surface of each of the substrates to the third and fourth deposition precursors by repeatedly rotating the substrates through the first, second, third, and fourth processing spaces for incrementally depositing the second film on each of the substrates.

According to one embodiment, the third deposition precursor may be selected from the group consisting of a silicon precursor, a germanium precursor, and a metal-containing precursor. The metal-containing precursor may be selected from the group consisting of a titanium precursor, an aluminum precursor, a hafnium precursor, a zirconium precursor, and combinations thereof. The fourth deposition precursor can include an oxidation source, a nitridation source, or both an oxidation source and a nitridation source. Additionally, a silicide source or other reactant agent can be used to remove or replace surface ligands of the third deposition precursor molecule to continue the ALD cycle. In one example, the oxidation source can include a plasma-excited oxidation gas. In another example, the nitridation source can include a plasma-excited nitridation gas.

According to one embodiment, etching the portion of the second film can include injecting a second etching gas into one or more of the processing spaces, and exposing the second film to the second etching gas to remove the portion of the second film. In another case, a material or second etching gas can be chosen to absorb within a certain depth of the original material (second film) to be removed, and a second chemical used to remove or etch the modified surface layer of the original material, providing a layer-by-layer etch removal of the original material, similar to an ALE mechanism. In one example, the second etching gas can include a plasma-excited etching gas.

With reference to FIG. 1, a batch processing system 10 for processing a plurality of substrates 200 comprises an input/output station 12, a load/lock station 14, a process chamber 16, and a transfer chamber 18 interposed between the load/lock station 14 and process chamber 16. The batch processing system 10, which is shown in a simplified manner, may include additional structures, such as additional vacuum-isolation walls coupling the load/lock station 14 with the transfer chamber 18 and the process chamber 16 with the transfer chamber 18, as understood by a person having ordinary skill in the art. The input/output station 12, which is at or near atmospheric pressure (e.g., 760 Torr), is adapted to receive wafer cassettes 20, such as front opening unified pods (FOUPs). The wafer cassettes 20 are sized and shaped to hold a plurality of substrates 200, such as semiconductor wafers having diameters of, for example, 200 or 300 millimeters.

The load/lock station 14 is adapted to be evacuated from atmospheric pressure to a vacuum pressure and to be vented from vacuum pressure to atmospheric pressure, while the process chamber 16 and transfer chamber 18 are isolated and maintained continuously under vacuum pressures. The load/lock station 14 holds a plurality of the wafer cassettes 20 introduced from the atmospheric pressure environment of the input/output station 12. The load/lock station 14 includes platforms 21, 23 that each support one of the wafer cassettes 20 and that can be vertically indexed to promote wafer transfers to and from the process chamber 16.

A wafer transfer mechanism 22 transfers substrates 200 under vacuum from one of the wafer cassettes 20 in the load/lock station 14 through the transfer chamber 18 and into the process chamber 16. Another wafer transfer mechanism 24 transfers substrates 200 processed in the process chamber 16 under vacuum from the process chamber 16 through the transfer chamber 18 and to the wafer cassettes 20. The wafer transfer mechanisms 22, 24, which operate independently of each other for enhancing the throughput of the batch processing system 10, may be selective compliant articulated/assembly robot arm (SCARA) robots commonly used for pick-and-place operations. The wafer transfer mechanisms 22, 24 include end effectors configured to secure the substrates 200 during transfers. The process chamber 16 may include distinct first and second sealable ports (not shown) used by wafer transfer mechanisms 22, 24, respectively, to access processing spaces inside the process chamber 16. The access ports are sealed when a deposition or etch process is occurring in the process chamber 16. Wafer transfer mechanism 22 is depicted in FIG. 1 as transferring unprocessed substrates 200 from wafer cassettes 20 on platform 21 of the load/lock station 14 to the process chamber 16. Wafer transfer mechanism 24 is depicted in FIG. 1 as transferring processed substrates 200 from the process chamber 16 to wafer cassettes 20 on platform 23 of the load/lock station 14.

The wafer transfer mechanism 24 may also transfer processed substrates 200 extracted from the process chamber 16 to a metrology station 26 for examination or to a cool down station 28 used for post-processing low pressure cooling of the substrates 200. The processes performed in the metrology station 26 may include, but are not limited to, conventional techniques used to measure film thickness and/or film composition, such as ellipsometry, and particle measurement techniques for contamination control.

The batch processing system 10 is equipped with a system controller 36 programmed to control and orchestrate the operation of the batch processing system 10. The system controller 36 typically includes a central processing unit (CPU) for controlling various system functions, chamber processes and support hardware (e.g., detectors, robots, motors, gas sources hardware, etc.) and monitoring the system and chamber processes (e.g., chamber temperature, process sequence throughput, chamber process time, input/output signals, etc.). Software instructions and data can be coded and stored within the memory for instructing the CPU. A software program executable by the system controller 36 determines which tasks are executed on substrates 200 including tasks relating to monitoring and execution of the processing sequence tasks and various chamber process recipe steps.

A susceptor 48 is disposed inside the process chamber 16. The susceptor 48 includes a plurality of circular substrate supports 52 defined in a top surface of the susceptor 48. Each of the substrate supports 52 is configured to hold at least one of the substrates 200 at a location radially within the peripheral sidewall 40 of the process chamber 16. The number of individual substrate supports 52 may range, for example, from 2 to 8. However, a person having ordinary skill in the art would appreciate that the susceptor 48 may be configured with any desired number of substrate supports 52 depending on the dimensions of the substrates 200 and the dimensions of the susceptor 48. Although this embodiment of the invention is depicted as having substrate supports 52 of a circular or round geometrical shape, one of ordinary skill in the art would appreciate that the substrate supports 52 may be of any desired shape to accommodate an appropriately shaped substrate.

The batch processing system 10 may be configured to process 200 mm substrates, 300 mm substrates, or larger-sized round substrates, which dimensioning will be reflected in the dimensions of substrate supports 52. In fact, it is contemplated that the batch processing system 10 may be configured to process substrates, wafers, or liquid crystal displays regardless of their size, as would be appreciated by those skilled in the art. Therefore, while aspects of the invention will be described in connection with the processing of substrates 200 that are semiconductor substrates, the invention is not so limited.

The substrate supports 52 are distributed circumferentially on the susceptor 48 about a uniform radius centered on an axis of rotation 54. The substrate supports 52 have approximately equiangular spacing about the axis of rotation 54, which is substantially collinear or coaxial with the azimuthal axis 42 although the invention is not so limited.

When the substrates 200 are processed in the process chamber 16, the rotation of the susceptor 48 may be continuous and may occur at a constant angular velocity about the axis of rotation 54. Alternatively, the angular velocity may be varied contingent upon the angular orientation of the susceptor 48 relative to an arbitrary reference point.

Partitions 68, 70, 72, 74 compartmentalize the process chamber 16 into a plurality of processing spaces 76, 78, 80, 82, while allowing the susceptor 48 and the substrate supports 52 to freely rotate around the axis of rotation 54. The partitions 68, 70, 72, 74 extend radially relative to the axis of rotation 54 toward the peripheral sidewall 40. Although four partitions 68, 70, 72, 74 are representatively shown, a person having ordinary skill in the art would appreciate that the process chamber 16 may be subdivided with any suitable plurality of partitions to form a different number than four processing spaces.

The batch processing system 10 further includes a purge gas supply system 84 coupled by gas lines to gas injectors 30, 34 penetrating through the peripheral sidewall 40. The purge gas supply system 84 is configured to introduce a flow of a purge gas to processing spaces 76 and 80. The purge gas introduced into the processing spaces 76 and 80 can comprise an inert gas, such as a noble gas (i.e., helium, neon, argon, xenon, krypton), or nitrogen, or hydrogen. During substrate processing, purge gas is continuously introduced into the processing spaces 76 and 80 to provide a gaseous curtain or barrier preventing, or at the least significantly limiting, transfer of first and second process materials between processing spaces 78, 82. The purge gas also provides an inert atmosphere inside processing spaces 76, 80 so that any process material layers carried by the substrates 200 are substantially unchanged when transported on the susceptor 48 through processing spaces 76, 80. Processing space 78 is juxtaposed between processing spaces 76, 80 and processing space 82 is juxtaposed between processing spaces 76, 80 so that processing spaces 76, 80 separate processing spaces 78 and 82 to provide mutual isolation for the first and second process materials.

Batch processing system 10 further includes a first process material supply system 90 coupled by gas lines to gas injector 32 penetrating through the peripheral sidewall 40, and a second process material supply system 92 coupled by gas lines to gas injector 38 penetrating through the peripheral sidewall 40. The first process material supply system 90 is configured to introduce a first process material to processing space 78, and a second process material supply system 92 configured to introduce a second process material to processing space 82. The first and second process material supply systems 90, 92 may each include one or more material sources, one or more heaters, one or more pressure control devices, one or more flow control devices, one or more filters, one or more valves, or one or more flow sensors as conventionally found in such process material supply systems.

The first process material can, for example, comprise a precursor, such as a composition having the principal atomic or molecular species found in a film formed on each of the substrates 200. For example, the precursor can originate as a solid phase, a liquid phase, or a gaseous phase, and it may be delivered to processing space 78 in either a gaseous or vapor phase, and either with or without the assistance of a carrier gas. The second process material can, for example, comprises a reactant, which may also have atomic or molecular species found in the film formed on substrates 200. For instance, the reactant can originate as a solid phase, a liquid phase, or a gaseous phase, and it may be delivered to processing space 82 in either a gaseous or vapor phase, and either with or without the assistance of a carrier gas.

The first process material supplied by the first process material supply system 90 to process chamber 16 and the second process material supplied by the second process material supply system 92 to process chamber 16 are selected in accordance with the composition and characteristics of a material to be deposited as the thin film on the substrate. For example, the first process material can include a silicon precursor or a metal organic precursor, and the second process material can include nitrogen ($N_2$) or oxygen ($O_2$). The temperature and pressure of the first and second process materials are also selected to promote thin film growth.

According to one embodiment, one or more of the first process material supply system 90, the second process material supply system 92, and the purge gas supply system 84 may be further configured for injecting an etching gas into one or more of the processing spaces 76, 78, 80, 82.

When the susceptor 48 is rotated about the axis of rotation 54, the arrangement of the substrate supports 52 about the circumference of the susceptor 48 allows each substrate 200 to be sequentially exposed to the different environment inside each of the processing spaces 76, 78, 80, 82. By way of example, upon rotation of the susceptor 48 through a closed path of a radians (360°), each of the substrates 200 is serially exposed to first process material in the environment inside the first processing space 78, then to the purge gas comprising the environment inside the second processing space 80, then to the second process material in the environment inside the third processing space 82, and finally to the purge gas comprising the environment inside the fourth processing space 76. Each of the substrates 200 has a desired dwell time in each of the respective processing spaces 76, 78, 80, 82, as mandated by the characteristics of the film to be deposited on each of the substrates 200, sufficient to form the film.

The deposition process is a deposition technique in which deposition of each atomic layer of the thin film, or a fraction thereof, on the substrates 200 is controlled by alternating and sequential introduction of appropriate gas phase precursors that react in a self-limiting manner to incrementally form or build the thin film. Within the first processing space 78, molecules of the first process material bond (chemically, by absorption, by adsorption, etc.) to the top surface of each of the substrates 200 to form a monolayer or a fraction of a monolayer of the first process material. Within the third processing space 82, the second process material reacts with the molecules of the first process material on each successive substrate 200. As the substrates 200 are rotated through the first and third processing spaces 78, 82, these steps are repeated with sequential subsequent exposures to the first and second process materials. The environments of first and second process materials in the first and third processing spaces 78, 82, respectively, are isolated from each other by the chemically non-reactive, purge gas environments inside the second and fourth processing spaces 80, 76.

The substrates 200 may be heated to a process temperature to promote the deposition process. In comparison with predominantly thermally driven CVD processes, ALD is predominantly chemically driven. Accordingly, ALD may be conducted at significantly lower substrate temperatures than CVD.

According to one embodiment of the invention, the first process material supply system 90 includes a plasma source that supplies the first process material to processing space 78 in the form of a plasma product comprising ions, radicals, or a combination thereof. Furthermore, the second process material supply system 92 may include a plasma source that supplies the second process material to processing space 82 in the form of a plasma product comprising ions, radicals, or a combination thereof. Further, in order to provide anisotropic etching, the substrate supports 52 may be electrically biased. In one example, rotation of the susceptor 48 may need to be stopped during the electrical biasing.

Figure 2A:
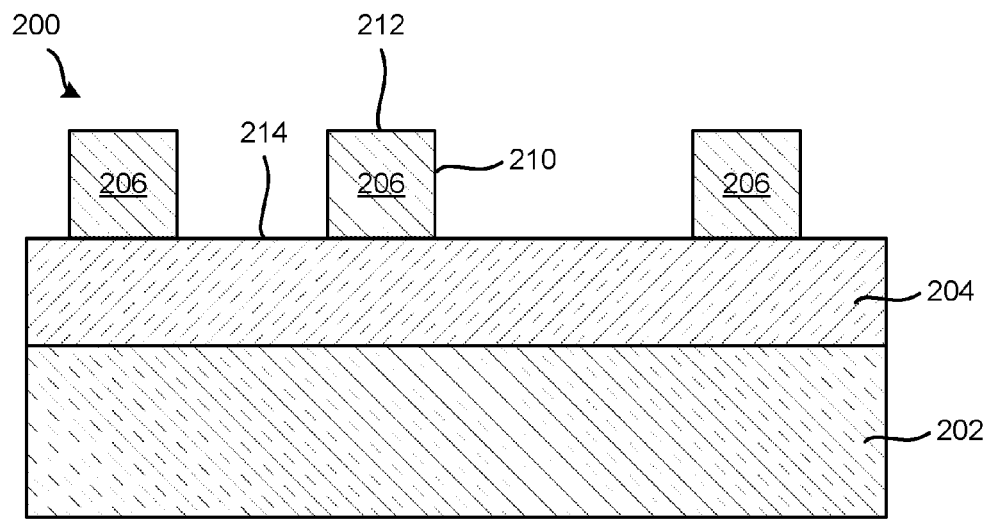
FIGS. 2A-2I show through schematic cross-sectional view a method for processing a substrate according an embodiment of the invention.

According to one embodiment of the invention, a method is provided for multi-film deposition and etching of plurality of substrates in a batch processing system. Referring now to FIGS. 1 and 2A, the method includes arranging the substrates 200 on the plurality of substrate supports 52 in a process chamber 16, and rotating the plurality of substrate supports 52 about an axis of rotation 54. The process chamber 16 contains processing spaces 76, 78, 80, 82 defined around the axis of rotation 54 in the process chamber 16.

According to one embodiment, the plurality of substrates 200 include a patterned film 206, a thin film 204, and a base film 202. The thin film 204 may comprise a conductive layer, a non-conductive layer, or a semi-conductive layer. For instance, the thin film 204 may include at least one material layer comprising a silicon-containing material, such as polysilicon, silicon dioxide, silicon nitride, silicon carbide, or silicon oxynitride, etc. The thin film 204 may comprise a low dielectric constant (i.e., low-k) or ultra-low dielectric constant (i.e., ultra-low-k) dielectric layer having a nominal dielectric constant value that is less than the dielectric constant of $SiO_2$, which is approximately 4 (e.g., the dielectric constant for thermal silicon dioxide ranges from about 3.8 to about 3.9). More specifically, the thin film 204 may have a dielectric constant ranging from about 1.6 to about 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organosiloxane), deposited using CVD. Examples of such films include BLACK DIAMOND CVD organosilicate glass (OSG) films, which are commercially-available from Applied Materials, Inc. (Santa Clara, Calif.), or CORAL CVD films, which are commercially-available from Novellus Systems, Inc. (San Jose, Calif.). Alternatively, these dielectric layers may include porous inorganic-organic hybrid films comprised of a single-phase, such as a silicon oxide-based matrix having $CH_3$ bonds that hinder full densification of the thin film 204 during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using a spin-on dielectric (SOD) technique. Examples of such films include FOX HSQ, which is commercially-available from Dow Corning (Midland, Mich.), XLK porous HSQ, which is also commercially-available from Dow Corning, and JSR LKD-5109, which is commercially-available from JSR Microelectronics (Sunnyvale, Calif.). Still alternatively, these dielectric layers may comprise an organic material deposited using an SOD technique. Examples of such films include SILK-I, SILK-J, SILK-H, SILK-D, and porous SILK semiconductor dielectric resins that are commercially-available from Dow Chemical, and GX-3, and GX-3P semiconductor dielectric resins commercially available from Honeywell (Morristown, N.J.).

The thin film 204 may be formed using a vapor deposition technique, such as CVD, plasma enhanced CVD (PECVD), ALD, plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL), Minato-ku, Tokyo. The Clean Track ACT 8 (200 mm), ACT 12 (300 mm), and Lithius (300 mm) coating systems provide coat, bake, and cure tools for SOD materials. The track system may be configured for processing substrates of varying sizes, include substrates having diameters of 100 mm, 200 mm, 300 mm, and greater. Other systems and methods for forming a thin film on a substrate are well known to those skilled in the art of both spin-on technology and vapor deposition technology.

The patterned film 206 contains horizontal surfaces 212 and vertical surfaces 210 that may be created using standard photolithographic techniques and etching techniques, as known to those of ordinary skill in the art. The patterned film 206, formed on the thin film 204, may comprise an anti-reflective coating (ARC) layer, e.g., a bottom ARC (BARC", and may optionally include additional layers not specifically shown herein. ARC layers possess anti-reflective properties that are suitable for use as an anti-reflective coating and that withstand degradation during a photo-resist removal step. Resistance to degradation during removal of the photo-resist allows for selective removal of the photo-resist using standard plasma ashing processes while leaving the sacrificial structure intact.

In some embodiments, the patterned film 206 may comprise a silicon-containing ARC layer, which enables double patterning of thin films by providing adequate mechanical properties for withstanding patterning processes, conformal deposition over ARC layer structures, and subsequent removal process(es). The patterned film 206 may further optionally include a hard mask layer or a planarization layer, such as an organic planarization layer (OPL) disposed between the thin film 204 and the ARC layer. In some embodiments, the patterned film 206 may comprise polysilicon, silicon nitride, or silicon oxide.

Additionally, according to another embodiment of the invention, the ARC layer, when etched, has mechanical properties that are sufficient to withstand the stresses associated with the deposition of a film on the ARC layer. For example, the silicon-containing ARC material, described above, may be generally stronger than standard organic ARC materials and may provide better selectivity between the photo-resist and ARC layer. Hence, the silicon-containing ARC material will be better able to withstand the stripping/ashing plasma and the stress induced during deposition of a spacer layer, thereby allowing for better profile control. Suitable materials for use in the ARC layer include, for example, antireflective coatings containing silicon that are commercially available from Dow Corning, Brewer Science, Inc., JSR Corp., Rohm and Haas, and Shin Etsu Chemical Co., Ltd.

Alternatively, rather than a silicon-containing ARC layer, the patterned film 206 may include a multi-layer arrangement that includes one or more silicon compounds and one or more materials that have anti-reflective properties, such as amorphous carbon. The silicon compounds add strength and selectivity to the multiple sacrificial films.

The patterned film 206 may be applied and selectively removed by a wet-patterning process using a coating/developing system, though the embodiment is not so limited. For example, in another embodiment, the patterned film 206 may be applied and selectively removed by a dry-patterning process comprising a coating/developing system in combination with a dry etch tool. In one embodiment, a thickness of the patterned film 206 may be between about 50 nanometers and about 100 nanometers. In another embodiment, the thickness of the patterned film 206 may be between about 20 nanometers and about 50 nanometers. In an alternative embodiment, the thickness of the patterned film 206 may be between about 100 nanometers and about 300 nanometers.

Figure 2B:
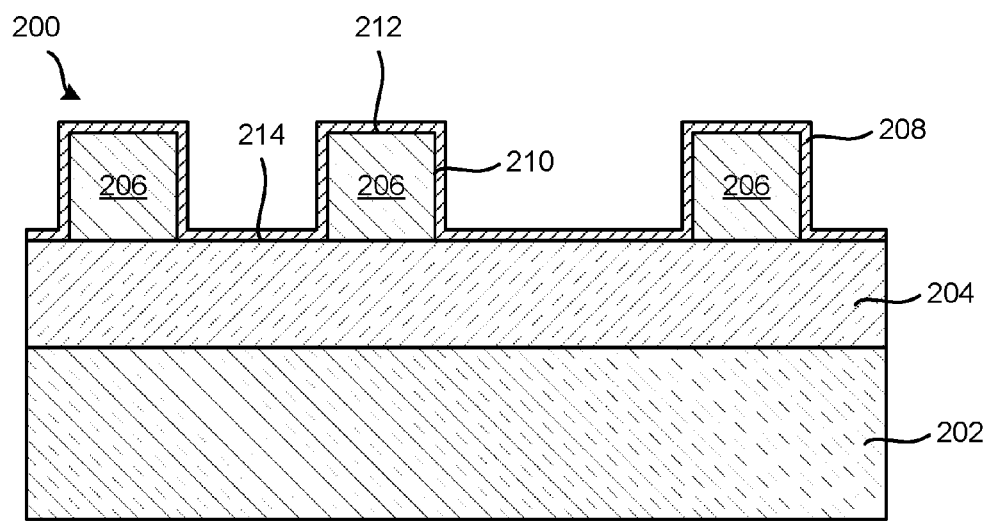

According to one embodiment, a first film 208 shown in FIG. 2B is conformally formed on the patterned film 206 by monolayer deposition (MLD) method. The MLD method may include, for example, an ALD method, which is based on the principle of the formation of a saturated monolayer of reactive precursor molecules by chemisorption. A typical MLD process for forming an AB film, for example, consists of injecting a first deposition precursor or reactant A ($R_A$) for a period of time in which a saturated monolayer of A is formed on the substrate. Then, $R_A$ is purged from the chamber using an inert gas. A second deposition precursor or reactant B ($R_B$) is then injected into the chamber, also for a period of time, to combine B with A and form the layer AB on the substrate. $R_B$ is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom. In some embodiments, the first film 208 may be selected from the group consisting of silicon dioxide, silicon nitride, silicon oxynitride, and a high-k material. The high-k material may be selected from the group consisting of titanium oxide, titanium nitride, aluminum oxide, aluminum nitride, hafnium oxide, zirconium oxide, and combinations thereof.

In accordance with one embodiment of the invention, the first film 208 may comprise silicon dioxide that is deposited by an ALD deposition in the batch processing system 10 shown and described above in FIG. 1. Deposition of the first film 208, and in particular, a silicon dioxide spacer layer, may proceed by sequential and alternating pulse sequences to deposit the different components (here, for example, silicon and oxygen) of the first film 208. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the process chamber 16.

Therefore, and as one exemplary embodiment, the substrate 200 with the patterned film 206 is disposed in the process chamber 16 of the batch processing system 10 and sequentially exposed to a gas pulse containing silicon and a gas pulse of an oxygen-containing gas, the latter of which may include $O_2$, $H_2O$, $H_2O_2$, ozone, plasma-exited oxygen (such as for use in PEALD systems), or a combination thereof, and optionally an inert gas, such as argon (Ar).

The silicon may react on the surfaces of the patterned film 206 and the thin film 204 to form a chemisorbed layer that is less than a monolayer thick. The oxygen from the gas pulse of the oxygen-containing gas may then react with the chemisorbed surface layer. By repeating this sequential gas exposure, i.e., by alternating the two exposures a plurality of times, it is possible to achieve layer-by-layer growth on the order of about 1 angstrom ($10^{-10}$ meter) per cycle until a desired thickness is achieved.

Figure 2C:
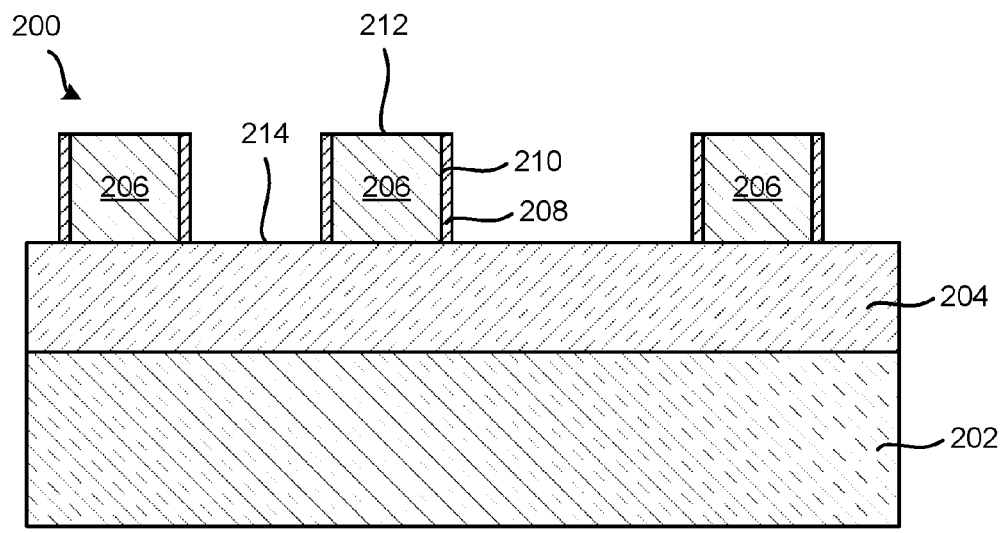

Referring still to FIG. 2B, and now also with reference to FIG. 2C, following deposition of the first film 208, the method includes etching a portion of the first film 208 on each of the substrates 200, where etching a portion of the first film 208 includes removing at least one horizontal portion of the first film 208 while substantially leaving vertical portions of the first film 208. More specifically, the first film 208 on the horizontal surfaces 212 of the patterned film 206 and the horizontal surface 214 of the thin film 204 is removed by the etching while the first film 208 on the vertical surface 210 remains.

Referring back to FIG. 1, the etching the portion of the first film 208 may be performed by injecting a first etching gas into one or more of the processing spaces 76, 78, 80, 82, and exposing the first film 208 to the first etching gas to remove the portion of the first film 208. According to one embodiment, the first etching gas can include a plasma-excited etching gas. According to one embodiment, the etching may include ALE, where different etching gases are injected into one or more of the processing spaces 76, 78, 80, 82. In one example, for etching a $SiO_2$ film, an etching gas (e.g., $BCl_3$) may be injected into processing space 78, $N_2$ purge gas may be injected into processing spaces 80 and 76, and plasma excited Ar gas may be injected into processing space 82. In another example, an etching gas may be injected into processing spaces 78 and 82, and $N_2$ purge gas may be injected into processing spaces 80 and 76.

Figure 2D:
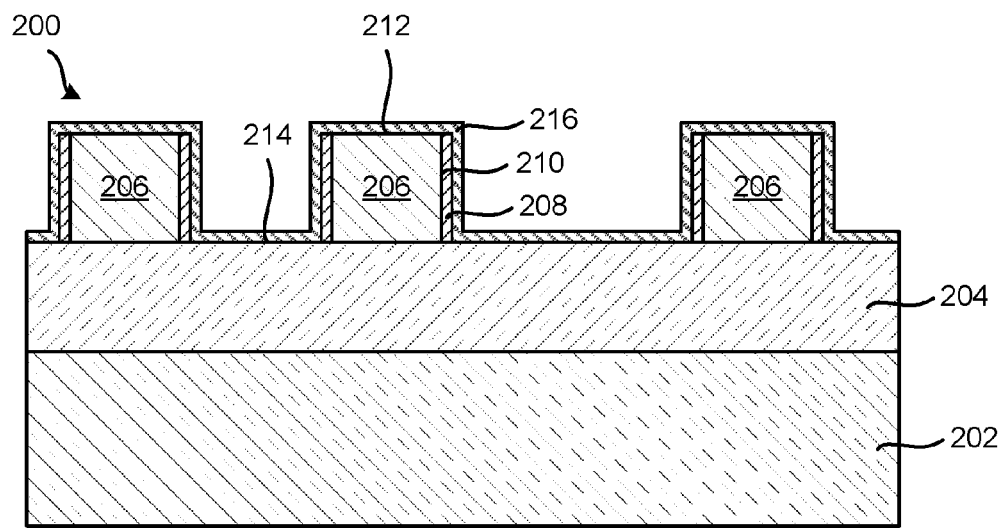

According to one embodiment, a second film 216 shown in FIG. 2D is conformally formed on the patterned film 206 and on the first film 208. The second film 216 may be deposited in the same or similar manner as described for the first film 208. In some embodiments, the second film 216 may be selected from the group consisting of silicon dioxide, silicon nitride, silicon oxynitride, and a high-k material. The high-k material may be selected from the group consisting of titanium oxide, titanium nitride, aluminum oxide, aluminum nitride, hafnium oxide, zirconium oxide, and combinations thereof.

Figure 2E:
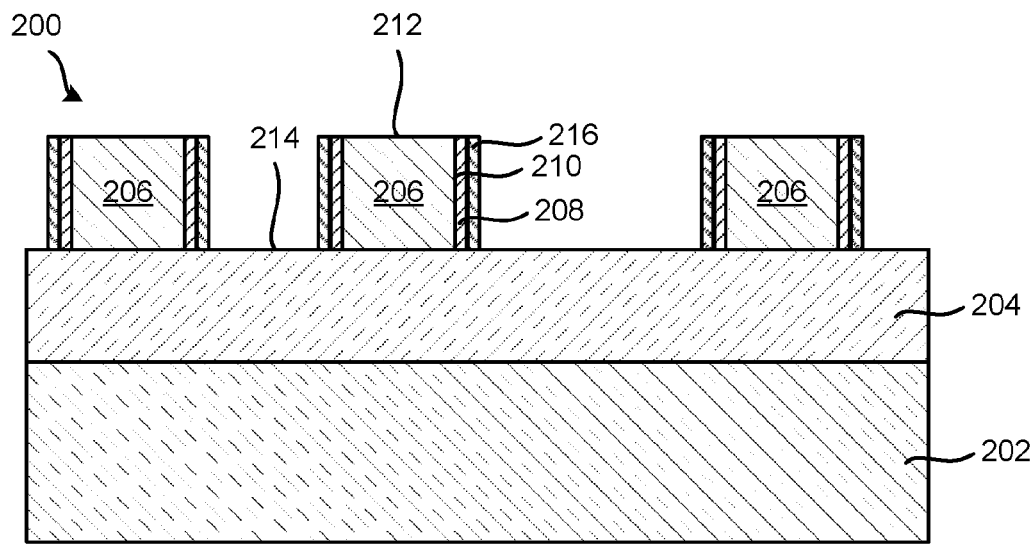

Referring still to FIG. 2D, and now also with reference to FIG. 2E, following deposition of the second film 216, the method includes etching a portion of the second film 216 on each of the substrates 200, where etching a portion of the second film 216 includes removing at least one horizontal portion of the second film 216 while substantially leaving vertical portions of the second film 216. More specifically, the second film 216 on the horizontal surfaces 212 of the patterned film 206 and the horizontal surface 214 of the thin film 204 is removed by the etching while the second film 216 on the vertical surface 210 remains.

Referring back to FIG. 1, etching the portion of the second film 216 may be performed by injecting a first etching gas into one or more of the processing spaces 76, 78, 80, 82, and exposing the second film 216 to the first etching gas to remove the portion of the second film 216. According to one embodiment, the first etching gas can include a plasma-excited etching gas. According to one embodiment, the etching may include ALE, where different etching gases are injected into one or more of the processing spaces 76, 78, 80, 82.

Figure 2F:
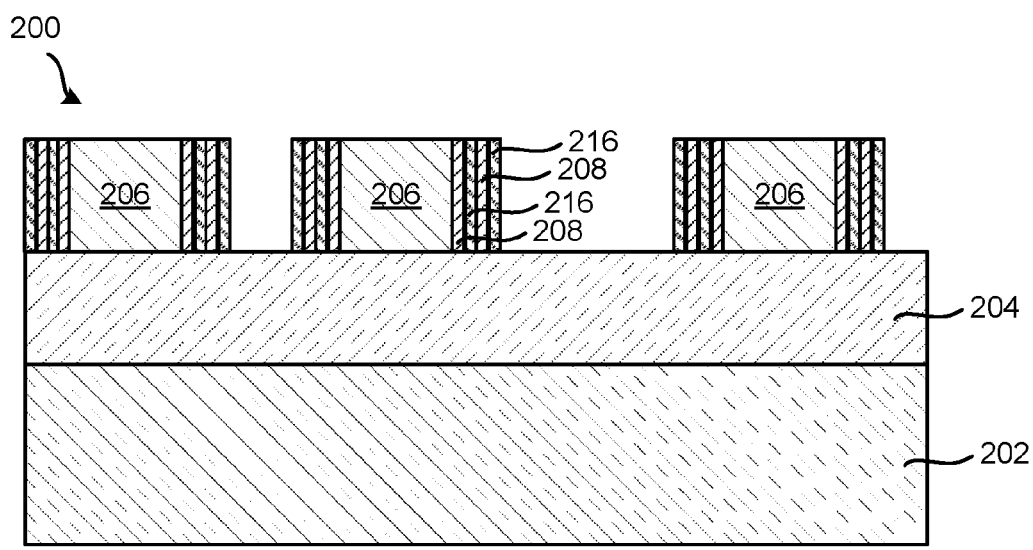

Turning now to FIG. 2F, the method may be repeated one or more times until desired number of first films 208 and second films 216 are formed on the patterned film 206.

Figure 2G:
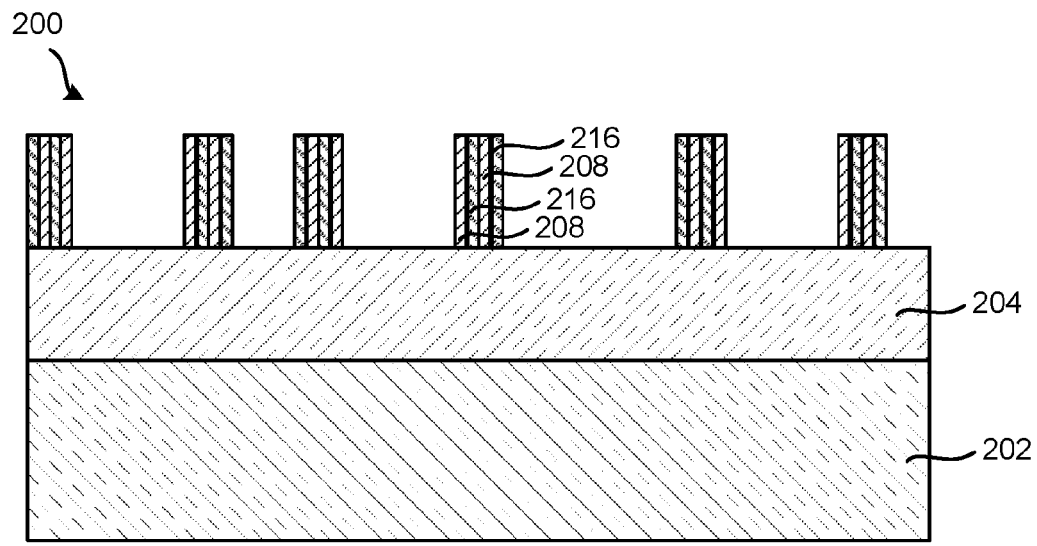

With reference now to FIG. 2G, those portions of the patterned film 206 not overlaid by first films 208 and second films 216, may be removed by an etching process. For example, the etching process may include any combination of wet or dry etching processes, as are known to those of ordinary skill the art. The dry etching processes may include dry plasma etching processes, dry non-plasma etching processes, or combinations thereof. For example, fluorocarbon chemistry or halogen-containing chemistry may be used to etch the remaining patterned film 206. Additionally, for example, a $C_xF_y$-based process chemistry, or a $C_xF_yH_z$-based process chemistry, or both may be used. Additionally yet, for example, $CH_2F_2$ and $CHF_3$ may be used to etch the remaining patterned film 206. Further, a $SF_6$-based chemistry may be used to etch the remaining patterned film 206. Additionally, a chlorine-based chemistry may be used depending on the material to etch.

Figure 2H:
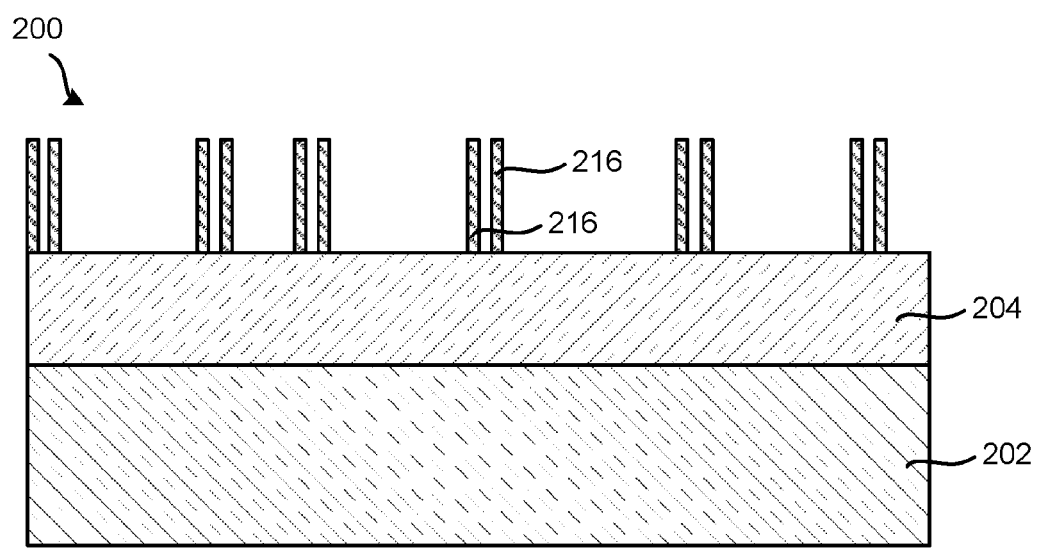

With the patterned film 206 removed, the vertical portions of the first films 208 or second films 216 may be removed. For example, as shown in FIG. 2H, the first films 208 are removed while the second films 216 remain. Thus, the second films 216 may comprise a material (e.g., SiN) that resist etching while the first films 208 (e.g., $SiO_2$) are etched. Removal of the first films 208 may proceed in accordance with the various etching methods described herein or other removal methods, as would be known to those of ordinary skill in the art.

Figure 2I:
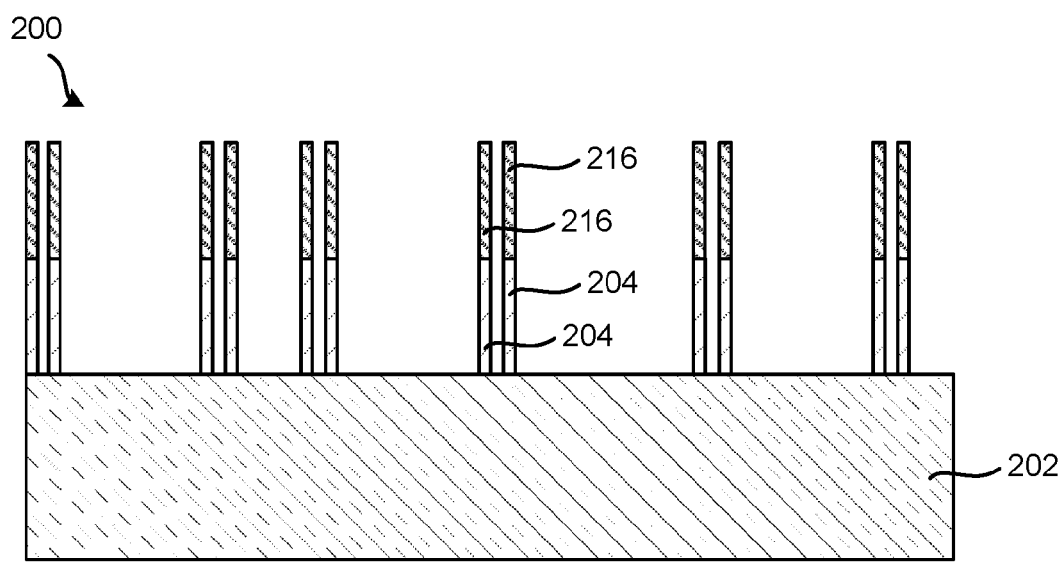

With formation of the pattern structure in FIG. 2H complete, i.e., only the vertical portions of the second films 216 remaining, the substrate 200 may be further processed as desired. In one exemplary embodiment of the present invention, and as shown in FIG. 2I, the vertical portions of the second films 216 may be used as a mask to transfer the image pattern to at least a portion of the underlying layers. Specially, the thin film 204 and, if desired, the base film 202, may be etched. Additional or alternative processes may then ensue.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

A method and apparatus for multi-film deposition and etching in a batch processing system have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for processing substrates in a batch processing system, the method comprising:
   a) arranging the substrates on a plurality of substrate supports in a process chamber, wherein the process chamber contains processing spaces defined around an axis of rotation in the process chamber;
   b) rotating the plurality of substrate supports about the axis of rotation;
   c) depositing a first film on a patterned film on each of the substrates by atomic layer deposition;
   d) etching a portion of the first film on each of the substrates, wherein etching a portion of the first film includes removing at least one horizontal portion of the first film while substantially leaving vertical portions of the first film;
   e) depositing a second film on the first film on each of the substrates by atomic layer deposition, wherein the second film contains a different material than the first film;
   f) etching a portion of the second film on each of the substrates, wherein etching a portion of the second film includes removing at least one horizontal portion of the second film while substantially leaving vertical portions of the second film; wherein depositing the first film includes
   injecting a first deposition precursor into a first processing space defined by a first included angle about the axis of rotation;
   exposing a top surface of each of the substrates to the first deposition precursor in the first processing space during each full rotation to bond molecules of the first deposition precursor;
   exposing each of the substrates to an inert atmosphere within a second processing space defined by a second included angle about the axis of rotation during each full rotation;
   injecting a second deposition precursor into a third processing space defined by a third included angle about the axis of rotation and separated from the first processing space by the second processing space;
   exposing the top surface of each of the substrates to the second deposition precursor during each full rotation;
   exposing each of the substrates to an inert atmosphere within a fourth processing space defined by a fourth included angle about the axis of rotation and separated from the second processing space by the third processing space; and
   re-exposing the top surface of each of the substrates to the first and second deposition precursors by repeatedly rotating the substrates through the first, second, third, and fourth processing spaces for incrementally depositing the first film on each of the substrates.

2. The method of claim 1, further comprising
   repeating c) and d), e) and f), or c), d), e) and f), at least once.

3. The method of claim 1, wherein the first film is selected from the group consisting of silicon dioxide, silicon nitride, silicon oxynitride, other metal or non-metal oxides, nitrides, or silicides, and a high-k material.

4. The method of claim 3, wherein the high-k material is selected from the group consisting of titanium oxide, titanium nitride, aluminum oxide, aluminum nitride, hafnium oxide, zirconium oxide, and combinations thereof.

5. The method of claim 1, wherein etching the portion of the first film includes
   injecting a first etching gas into one or more of the processing spaces; and
   exposing the first film to the first etching gas to remove the portion of the first film.

6. The method of claim 5, wherein the first etching gas includes a plasma-excited etching gas.

7. The method of claim 1, wherein, the etching the portion of the first film includes
   atomic layer etching, where different etching gases are injected into one or more of the processing spaces.

8. The method of claim 1, wherein the first deposition precursor is selected from the group consisting of a silicon precursor, a germanium precursor, a metal-containing precursor, and a combination thereof.

9. The method of claim 1, wherein the second deposition precursor includes an oxidation source, a nitridation source, or both an oxidation source and a nitridation source.

10. The method of claim 1, wherein the second deposition precursor includes a silicide source or a reactant capable of removing or replacing surface ligands of the first deposition precursor to continue the atomic layer deposition.

11. The method of claim 1, wherein the second film is selected from the group consisting of silicon dioxide, silicon nitride, silicon oxynitride, other metal or non-metal oxides, nitrides, or silicides, and a high-k material.

12. The method of claim 11, wherein the high-k material is selected from the group consisting of titanium oxide, titanium nitride, aluminum oxide, aluminum nitride, hafnium oxide, zirconium oxide, and combinations thereof.

13. The method of claim 1, wherein etching the portion of the second film includes
   injecting a second etching gas into one or more of the processing spaces; and
   exposing the second film to the second etching gas to remove the portion of the second film.

14. The method of claim 13, wherein the second etching gas includes a plasma-excited etching gas.

15. The method of claim 1, wherein etching the portion of the second film includes
   atomic layer etching, where different etching gases are injected into one or more of the processing spaces.

16. A method for processing substrates in a batch processing system, the method comprising:
   a) arranging the substrates on a plurality of substrate supports in a process chamber, wherein the process chamber contains processing spaces defined around an axis of rotation in the process chamber;
   b) rotating the plurality of substrate supports about the axis of rotation;
   c) depositing a first film on a patterned film on each of the substrates by atomic layer deposition;
   d) etching a portion of the first film on each of the substrates, wherein etching a portion of the first film includes removing at least one horizontal portion of the first film while substantially leaving vertical portions of the first film;
   e) depositing a second film on the first film on each of the substrates by atomic layer deposition, wherein the second film contains a different material than the first film; and
   f) etching a portion of the second film on each of the substrates, wherein etching a portion of the second film includes removing at least one horizontal portion of the second film while substantially leaving vertical portions of the second film, wherein depositing the second film includes
      injecting a third deposition precursor into a first processing space defined by a first included angle about the axis of rotation;
      exposing a top surface of each of the substrates to a third deposition precursor in the first processing space during each full rotation to bond molecules of the third deposition precursor;
      exposing each of the substrates to an inert atmosphere within a second processing space defined by a second included angle about the axis of rotation during each full rotation;
      injecting a fourth deposition precursor into a third processing space defined by a third included angle about the axis of rotation and separated from the first processing space by the second processing space;
      exposing the top surface of each of the substrates to the fourth deposition precursor during each full rotation;
      exposing each of the substrates to an inert atmosphere within a fourth processing space defined by a fourth included angle about the axis of rotation and separated from the second processing space by the third processing space; and
      re-exposing the top surface of each of the substrates to the third and fourth deposition precursors by repeatedly rotating the substrates through the first, second, third, and fourth processing spaces for incrementally depositing the second film on each of the substrates.

17. The method of claim 16, wherein the third deposition precursor is selected from the group consisting of a silicon precursor, a germanium precursor, a metal-containing precursor, and a combination thereof.

18. The method of claim 16, wherein the fourth deposition precursor includes an oxidation source, a nitridation source, or both an oxidation source and a nitridation source.

19. The method of claim 16, wherein the fourth deposition precursor includes a silicide source or a reactant capable of removing or replacing surface ligands of the third deposition precursor to continue the atomic layer deposition.

* * * * *